United States Patent [19]
Malhi

[11] Patent Number: 5,723,891
[45] Date of Patent: *Mar. 3, 1998

[54] TOP-DRAIN TRENCH BASED RESURF DMOS TRANSISTOR STRUCTURE

[75] Inventor: Satwinder Malhi, Garland, Tex.

[73] Assignee: Texas Instruments Incorporated, Dallas, Tex.

[*] Notice: The term of this patent shall not extend beyond the expiration date of Pat. No. 5,640,034.

[21] Appl. No.: 463,954

[22] Filed: Jun. 5, 1995

Related U.S. Application Data

[63] Continuation of Ser. No. 883,985, May 18, 1992, Pat. No. 5,640,034.
[51] Int. Cl.⁶ .......................... H01L 29/76; H01L 29/94
[52] U.S. Cl. .......................... 257/341; 257/330; 257/332; 257/333; 257/335
[58] Field of Search .......................... 257/330, 332, 257/333, 335, 341

[56] References Cited

U.S. PATENT DOCUMENTS

| | | | |
|---|---|---|---|
| 4,048,649 | 9/1977 | Bohn | 357/43 |
| 4,243,997 | 1/1981 | Natori et al. | 357/23 |
| 4,296,429 | 10/1981 | Schroeder | 357/55 |
| 4,835,584 | 5/1989 | Lancaster | 357/23.1 |
| 4,914,058 | 4/1990 | Blanchard | 437/203 |
| 4,949,142 | 8/1990 | Contiero et al. | 357/23.4 |
| 5,034,785 | 7/1991 | Blanchard | 357/23.4 |
| 5,134,448 | 7/1992 | Johnsen et al. | 357/23.4 |

*Primary Examiner*—Valencia Martin Wallace
*Attorney, Agent, or Firm*—Jacqueline J. Garner; W. James Brady, III; Richard L. Donaldson

[57] ABSTRACT

A top drain trench based RESURF DMOS (reduced surface field double diffused MOS) transistor structure provides improved RDSon performance by minimizing transistor cell pitch. The transistor includes a gate, a source and drain. The trench may include a nonuniform dielectric lining. A drain drift region partially surrounds the trench. Current flows laterally enabling multiple trench based RESURF DMOS transistors to be formed on a single semiconductor die. The addition of an isolation region to electrically isolate the source from the substrate allows the power transistor to be incorporated into high side driver applications as well as other application mandating electrical isolation between the source and ground.

4 Claims, 2 Drawing Sheets

TOP-DRAIN TRENCH BASED RESURF DMOS TRANSISTOR STRUCTURE

This is a continuation of application Ser. No. 07/883,985 filed on May 18, 1992, U.S. Pat. No. 5,640,034.

FIELD OF THE INVENTION

This invention is in the field of semiconductor integrated circuits and relates primarily to high power devices.

BACKGROUND OF THE INVENTION

In the field of power integrated circuits much work has been done in the development of power transistors. Advancements were made enabling LDMOS power transistors (lateral double diffused MOS transistor) to exhibit low "on-resistance" (RDSon) and high breakdown capability concurrently through a reduced surface field (RESURF) technique (J. A. Appels and H. M. J. Vaes, "High Voltage Thin Layer Devices (RESURF Devices)", *IEDM Tech. Digest*, pp. 238–241, 1979).

In IC design, semiconductor die area is crucial. Generally, an increase in transistor area results in a decrease in transistor RDSon. A trade-off between transistor performance and device cost becomes a crucial design constraint. This issue has driven research into new transistor structures that provide low RDSon while simultaneously minimizing transistor area. One proposed improvement has been the development of a trench DMOS transistor (Ueda, Daisuke; Takagi, Hiromitsu; Kano, Gota; "An Ultra-Low On-Resistance Power MOSFET Fabricated by Using a Fully Self-Aligned Process", *IEEE Transactions on Electron Devices*, Vol. ED-34, No.4, April 1987). Other improvements are needed.

It is an object of this invention to provide a high voltage power transistor exhibiting improved RDSon performance while reducing transistor area. It is another object of this invention to provide a power transistor of trench DMOS technology type, having its source isolated from its substrate. Other objects and advantages of the invention will be apparent to those of ordinary skill in the art having reference to the following description and drawings.

SUMMARY OF THE INVENTION

A lateral power transistor structure has a source, a drain, and a gate formed in a trench lying between the source and drain. The trench may include a nonuniform isolation lining. This structure forms a top-drain trench RESURF DMOS (REduced SURface Field double diffused MOS) transistor having improved RDSon performance with minimized transistor cell pitch. The top-drain structure enables multiple trench based RESURF LDMOS transistors to be formed on a single semiconductor die. An isolation region may be included underneath the source to isolate the source from the substrate. This advantageously allows the device to be incorporated in high side driver applications.

DESCRIPTION OF THE PREFERRED EMBODIMENT

Figure 1:
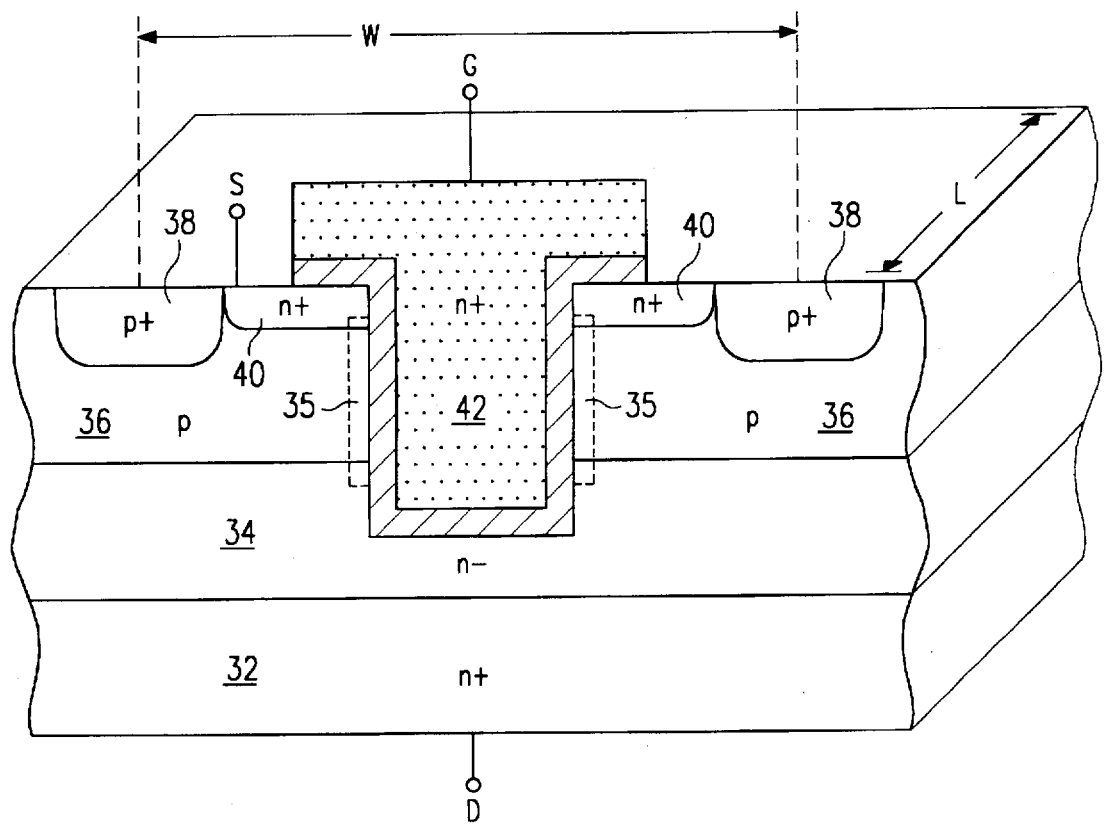
FIG. 1 is a prior art cross-section drawing illustrating a vertical trench based DMOS transistor.

FIG. 1 is a prior art cross-section illustrating a vertical trench based DMOS transistor 30. Such a device is found in the article of Ueda et al described in the background. The transistor has a substrate forming a drain 32, a drift region 34, a p-well region 36, a backgate 38, and a source 40. A trench is formed through p-well region 36 into drift region 34. The trench is uniformly lined with an oxide and filled with polysilicon to form a gate 42. By providing gate trench 42, channels 35 (in p-well region 36) lie adjacent the trench. This reduces lateral channel spacing occurring in previous vertical DMOS (double diffused MOS) transistors without the trench. Unfortunately, trench based DMOS transistor 30 is a vertical device (drain region 32 is the substrate) which prohibits individually isolated trench based DMOS transistors 30 to be constructed on the same die. Vertical trench power transistors made in a substrate share a common drain terminal and therefore are not individually isolated from one another.

Figure 2:
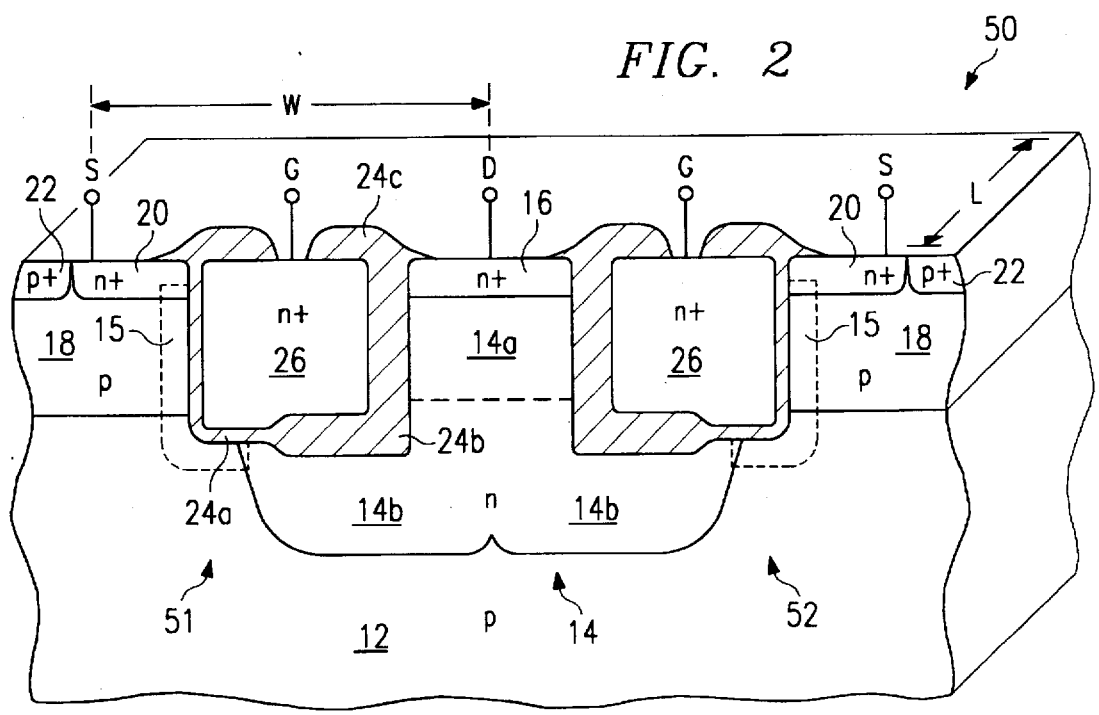
FIG. 2 is a cross-section drawing illustrating the preferred embodiment of the invention.

FIG. 2 is a cross-section drawing illustrating the preferred embodiment of the invention, a multi-cell top-drain trench based RESURF DMOS transistor 50. Transistor 50 consists of transistor cells 51 and 52. Transistor cells 51 and 52 are similarly constructed. They share a drain 16. Transistor cell 51 has a source 20, a drain 16, and a gate 26 formed in the face of a substrate 12. Gate 26 lies in a trench 27 between source 20 and drain 16. Drift region 14 partially surrounds trench 27. Trench 27 is lined with a non-uniform oxide 24a and 24b. A conductive material such as polysilicon fills the trench and forms gate 26. Oxide 24a is a thin dielectric and forms the gate oxide 24a of transistor cell 51. Oxide 24b is a thicker oxide and lines the trench near drift region 14 for transistor breakdown protection. A p-well region 18 lies on one side of the trench with a source 20 and backgate 22 in p-well region 18. The portion of p-well region 18 and substrate 12 near gate oxide 24a becomes inverted under the influence of an applied gate voltage and forms a channel 15. Channel 15 conducts current from drift region 14 to source 20 when a voltage at gate 26 increases above the transistor 50 threshold voltage ($V_t$). A drain region 16 lies in drift region 14. An oxide 24c covers gate 26 and has contact openings in it for contact to gate 26.

Unlike trench DMOS transistor 30 of FIG. 1, which is a vertical device having drain region 32 in the substrate, transistor 50 of FIG. 2 is a top-drain device (drain 16 is contacted from the top of the wafer). Current flows both vertically and laterally. Current moves vertically from drain 16 into drift region 14, laterally from drift region 14 into channel 15, and vertically again from channel 15 to source 20. The top-drain feature advantageously allows multiple isolated trench based lateral DMOS transistors to be formed on a single substrate.

Top-drain trench based RESURF DMOS transistor 50 significantly reduces the cell pitch (W) from prior art lateral devices. Prior art lateral devices have a cell pitch (W) of approximately 8 microns while top-drain trench based RESURF DMOS transistor 50 has a cell pitch of approximately 3 microns. This provides an increase in transistor density by a factor greater than two. A greater packing density of individual transistor cells provides more channel area per unit of transistor area. RDSon is inversely proportional to transistor area, therefore, providing an increase in channel area for a given area of silicon decreases transistor RDSon.

In FIG. 2 transistor 50 may be advantageously fabricated in the following manner. A plurality of p-well regions 18 and drift regions 14 are formed in a P type substrate 12 such that p-well region 18 and drift region 14 are adjacent to and in contact with each other. Drift region 14 is composed of two regions 14a and 14b which will be explained below. Trenches are etched into the wafer at the p-well 18 and drift region 14 interfaces. The trenches extend into the wafer through p-well regions 18 and into drift regions 14. A SiO$_2$ layer of approximately 500 angstroms is formed over the wafer surface and also lines the inside of the trenches. A Si$_3$N$_4$ layer of approximately 1500 angstroms is formed over this SiO$_2$ layer. A patterned resist is deposited over the wafer surface and an isotropic etch removes the portion of Si$_3$N$_4$ overlying drift regions 14 and removes the portion of Si$_3$N$_4$ that is not protected by resist in the trenches. Therefore, each trench is only partially lined with Si$_3$N$_4$. An N type implant forms small tanks 14b in portions of substrate 12 not covered by resist. These N type tanks 14b out-diffuse due to thermal cycling and annealing and connect with drift region 14a. A SiO$_2$ layer 24b of approximately 2500 angstroms is formed over the wafer surface causing the area unmasked by Si$_3$N$_4$ to increase in thickness. The patterned Si$_3$N$_4$ is removed leaving the trench SiO$_2$ layer thickness nonuniform; approximately half the trench having an oxide lining thickness of about 2500 angstroms (24b) and approximately half the trench having an oxide lining thickness of 500 angstroms. Areas of 500 angstrom oxide are wet etched and another layer 24a of SiO$_2$ (500 angstroms) is grown in its place. This is done to provide a high quality thin oxide 24a. A thick layer of N+ doped polysilicon is formed over transistor 50 filling the trenches and forming transistor gate 26. The polysilicon layer is etched back to the surface of p-well regions 18 and drift regions 14. A SiO$_2$ layer 24c of approximately 500 angstroms is formed over the wafer surface. A masked N+ implant forms source regions 20 in p-well regions 18 and drain regions 16 in drift regions 14. A P+ implant forms backgate 22 in p-well region 18. A SiO$_2$ layer of approximately 5000 angstroms (not shown in FIG. 2) is formed over the wafer surface. Contact openings are etched into the thick oxide layer down to drain 16, source 20, and gate 26 regions. A patterned metal layer (not shown in FIG. 2) is deposited over transistor 50 making electrical contact to drain 16, source 20 and gate 26 through the contact openings.

Figure 3:
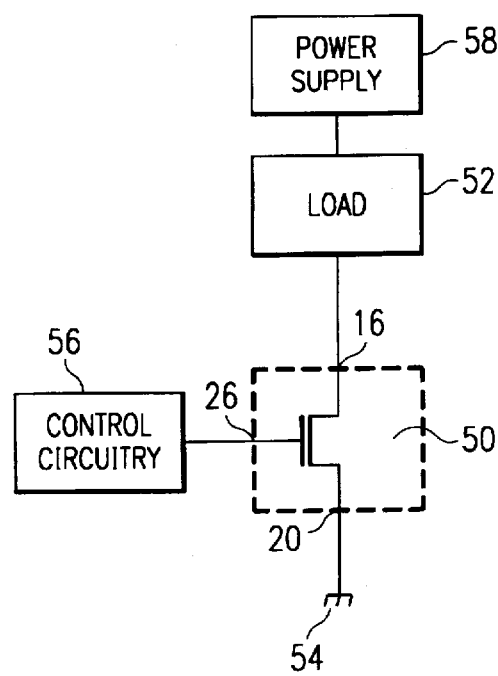
FIG. 3 is a circuit diagram illustrating a low side driver configuration.

FIG. 3 illustrates transistor 50 of FIG. 2 connected as a low side driver with drain 16 connected to load 52, source 20 connected to circuit ground 54, and gate 26 connected to control circuitry 56. When a large voltage (greater than the transistor 50 threshold voltage) appears on gate 26, channel 15 (formed in p-well region 18 and substrate 12) inverts and current flows from drain 16 through drift region 14, through channel 15, and finally through source 20. Drift region 14 doping, width and depth are designed such that it becomes fully depleted at the rated breakdown voltage, thus leading to uniform spread of the electric field in the device. This allows drift region 14 to be more highly doped for a given breakdown voltage than would be possible otherwise, further decreasing RDSon.

During breakdown conditions in FIG. 2, when drain 16 reaches a high voltage (greater than the maximum rating for normal operation), the following occurs: as drain 16 increases in voltage, a vertical depletion region grows at the drift region 14-substrate region 12 boundary. Simultaneously, depletion regions form on the sides of trenches and grow in toward the middle of the drift region 14. This horizontal depletion phenomena is caused by the voltage at gate 26 being significantly lower than the voltage on drain 16. Gate 26 acts as a field plate, pushing electrons away from trench gate oxide wall 24b and forming a depletion region. Thus drift region 14 will become completely depleted by both vertical and horizontal depletion components. If the applied voltage of drain 16 is increased, the electric field will ultimately reach the critical field value causing transistor 50 to break down. Current then flows from drain 16 through depleted drift region 14 into substrate 12. This prevents breakdown from occurring near thin gate oxide 24a lying next to channel 15. Breakdown thus advantageously occurs near thick gate oxide 24b which is more rugged than thin gate oxide 24a.

Figure 4:
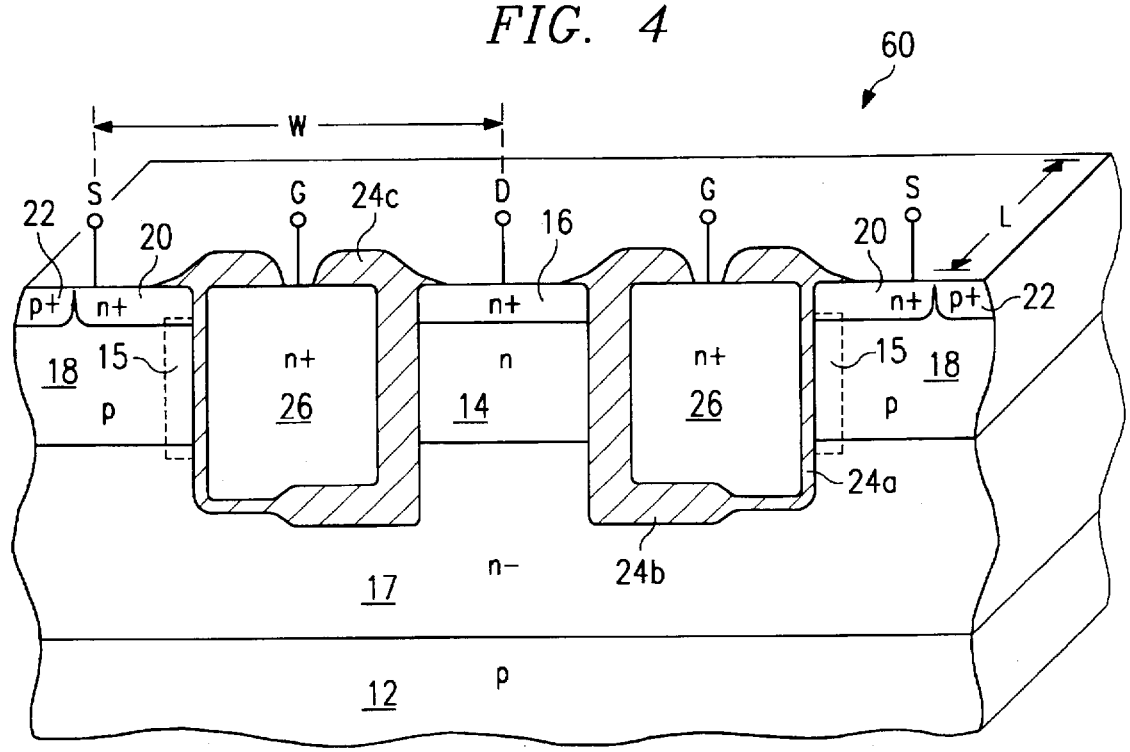
FIG. 4 is a cross-section drawing illustrating an alternative embodiment of the invention.

FIG. 4 is an alternative embodiment of the invention. Transistor 60 of FIG. 4 is similar to transistor 50 of FIG. 2 except for an isolation region 17. Isolation region is formed within substrate 12 underneath p-well region 18. It is oppositely doped from p-well region 18 and thus electrically isolates source 20 from substrate 12. This advantageously allows transistor 60 to be utilized in applications such as a high side driver which requires electrical isolation between source 20 and substrate 12 (source 20 not connected to ground). During breakdown conditions, transistor 60 operates like transistor 50.

Top-drain trench based RESURF DMOS transistor 60 of FIG. 4 is preferably fabricated in a similar manner as transistor 50 in FIG. 2 except that isolation region 17 is formed before formation of p-well regions 18 and drift regions 14 so that p-well regions 18 and drift regions 14 are formed within it.

Figure 5:
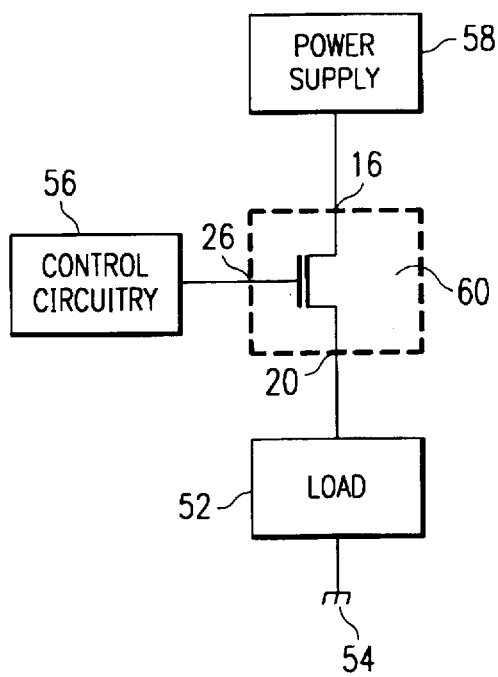
FIG. 5 is a circuit diagram illustrating a high side driver configuration.

A high side driver, shown in FIG. 5, consists of transistor 60 of FIG. 4 with drain 16 connected to power supply 58, source 20 connected to load 52, and gate 26 connected to control circuitry 56. When control circuitry 56 mandates transistor 60 turn on, current flows from power supply 58, through transistor 60, through load 52 to circuit ground 54. Having source 20 isolated from the substrate (which is coupled to circuit ground) advantageously avoids load 52 "shorting out". This enables load 52 to be driven properly.

In an alternative embodiment of fabricating both transistor 50 and transistor 60, after the etching of trenches, a thick layer of SiO$_2$ is deposited over the wafer such that the oxide fills the trenches in a similar manner as the polysilicon deposition described in FIG. 2. A patterned resist is deposited over the wafer such that half the trench is exposed to an etch. The etch removes a portion of the oxide thickness such that a nonuniform oxide thickness exists in the trenches. The remainder of the fabrication process follows the process described for FIG. 2.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A transistor, comprising:
    a trench formed in a semiconductor substrate;
    a nonuniform dielectric lining formed in the trench, the nonuniform dielectric lining having a thin portion and a thick portion;
    a drain drift region formed in the semiconductor substrate, the drain drift region abutting and substantially surrounding the thick portion of the nonuniform dielectric lining;

a drain region formed in a top surface of the semiconductor substrate in the drain drift region;

a source region formed in the semiconductor substrate, the source region abutting the thin portion of the nonuniform dielectric lining, wherein the region between the source region and the drain drift region along the thin portion of the nonuniform dielectric lining forms a channel region; and a gate formed in the trench.

2. The transistor of claim 1 further comprising an isolation region formed below the source region, wherein the isolation region electrically isolates the source region from the semiconductor substrate.

3. A transistor, comprising:

a trench formed in a semiconductor substrate;

a nonuniform dielectric lining formed in the trench, the nonuniform dielectric lining having a thin portion and a thick portion;

a drain drift region formed in the semiconductor substrate, the drain drift region abutting and substantially surrounding the thick portion of the nonuniform dielectric lining;

a drain region formed in a top surface of the semiconductor substrate in the drain drift region;

a p-well region formed in the semiconductor substrate, the p-well region abutting and substantially surrounding the thin portion of the nonuniform dielectric lining;

a source region formed in the p-well region, the source region abutting the thin portion of the nonuniform dielectric lining, wherein the region within the p-well region between the source region and the drain drift region along the thin portion of the nonuniform dielectric lining forms a channel region; and a gate, formed in the trench.

4. The transistor of claim 3 further comprising an isolation region formed below the p-well region, wherein the isolation region electrically isolates the source region from the semiconductor substrate.

* * * * *